United States Patent [19]

Hailey et al.

[11] Patent Number: 4,991,010
[45] Date of Patent: Feb. 5, 1991

[54] DUAL-MODE IMAGE INTERPOLATION FILTER OPERABLE IN A FIRST MODE FOR STORING INTERPOLATION COEFFICIENTS AND IN A SECOND MODE FOR EFFECTING TELEVISION STANDARDS CONVERSION AT A PIXEL RATE

[75] Inventors: Keith R. Hailey, Amershan Buckinghamshire; John J. Storey, Hertfordshire, both of England

[73] Assignee: Eastman Kodak Company, Rochester, N.Y.

[21] Appl. No.: 435,867

[22] Filed: Nov. 13, 1989

[51] Int. Cl.$^5$ ............................................. H04N 7/01
[52] U.S. Cl. ................................... 358/140; 364/724.1
[58] Field of Search ................ 358/140, 138, 11, 214; 364/724.1; 382/42

[56] References Cited

U.S. PATENT DOCUMENTS

| | | | |
|---|---|---|---|
| 4,460,890 | 7/1984 | Busby | 364/724.1 X |
| 4,573,136 | 2/1986 | Rossiter | 364/728 |
| 4,584,659 | 4/1986 | Stikvoort | 364/724 |
| 4,709,394 | 11/1987 | Bessler et al. | 364/724.1 X |
| 4,727,505 | 2/1988 | Konishi et al. | 364/728 |
| 4,802,111 | 1/1989 | Barkan et al. | 364/724.1 |
| 4,823,201 | 4/1989 | Simon et al. | 358/140 X |

OTHER PUBLICATIONS

"Programmable Digital Filter for High-Speed Applications", Demmer et al; IEEE Proceedings 1988; pp. 1285-1288.
"An Approach to the Implementation of Digital Filters", Jackson et al; IEEE Transaction, vol. Au-16 #3; Sep. '68, pp. 413-421.
Gabel; "Parallel Arithmetic Hardware Structure for Recursive Digital Filtering", IEEE Trans., Aug. '84, pp. 255-258.
Specification for the L64260/L64261 High-Speed Versatile FIR Filter.
Specification for the TMC 230 Image Resampling Sequencer.

*Primary Examiner*—Victor R. Kostak
*Attorney, Agent, or Firm*—David M. Woods

[57] ABSTRACT

An interpolation filter is used in television standards conversion to decimate an input sequence of higher definition signals into an output sequence of lower definition signals. The filter is partitioned into a plurality of computational stages. Within each stage, the decimation coefficients are stored in a random access coefficient memory and applied to a multiplier to generate the product of a digital input signal and a stored coefficient. The RAM is operable in two modes: a first mode in which new sets of coefficients are serially input to the RAM during the field blanking period and a second mode in which different stored coefficients are output to the multiplier for consecutive digital signals to effect a non-integer decimation ratio.

6 Claims, 4 Drawing Sheets

DUAL-MODE IMAGE INTERPOLATION FILTER OPERABLE IN A FIRST MODE FOR STORING INTERPOLATION COEFFICIENTS AND IN A SECOND MODE FOR EFFECTING TELEVISION STANDARDS CONVERSION AT A PIXEL RATE

FIELD OF THE INVENTION

This invention pertains to the field of signal processing for television standards conversion and more particularly for conversion of a high definition signal processing channel to a lower definition (NTSC/PAL) channel.

BACKGROUND OF THE INVENTION

A film scanner capable of high definition television (HDTV) resolution preferably includes a standards converter in its signal processing to convert from the film scanning standards employed by the film scanner to HDTV standards or to conventional 625/525 line (PAL/NTSC) standards. The general function employed is that of interpolation, that is, the number of output samples is a computed (lesser/greater) function of the number of the input samples. More particularly, the specific function employed to convert to lower definition is that of decimation, that is, a reduction in the number of output samples compared to input samples.

High speed finite impulse response (FIR) filter processers have been disclosed in configurations permitting decimation, interpolation, adaptive filtering, and two dimensional filtering (e.g., see the L64260/L64261 High Speed Versatile FIR Filter (VFIR), produced by LSI Logic Corporation, which also may be configured to permit the filter coefficients to change at the same rate as the input data). Such filters calculate a computational algorithm in a plurality of computational stages arranged in parallel with the outputs thereof summed to form the output of the filter (e.g., the L64260/L64261 has four stages each with a high speed MAC and four data and four coefficient registers).

When an FIR filter processor is used in the digital signal processing channel of a film scanner to convert from higher to lower definition, the decimation factor is rarely an integer. This places special demands on the horizontal FIR function as the filter coefficients need to be changed at the input data rate, i.e., for an image input, at the pixel rate. On top of that requirement, the interpolation (decimation) parameters must be programmable to accommodate the various input film formats and output television standards. In addition, a scanner application should include the facility for pan and zoom to accommodate the translation between the scanned film format and the 16:9 HDTV or 4:3 625/525 (PAL/NTSC) line aspect ratio. This requires varying interpolator (decimation) characteristics field by field for different zoom and pan ratios.

SUMMARY OF THE INVENTION

It is an object of the invention to provide a computational stage capable of (1) varying the decimator or interpolator coefficients on a pixel-by-pixel basis by high speed selection of the appropriate stored coefficient, and (2) loading a new set of coefficients during a field blanking interval.

It is a further object of the invention to partition the overall interpolation filter into a series of computational stages, and to implement each stage with a processing element that minimizes the pin count, the component count, and the interconnections between stages.

It is a further object of the invention to provide a manufacturable architecture for the interpolator that is cost effective even for low production quantities.

The aforementioned objects are provided by an interpolation filter employing a plurality of computational stages arranged in parallel, each with random access coefficient memory (RAM) configured for operation in two modes, one mode dedicated to high speed provision of interpolation coefficients to a multiplier that generates the product of an interpolation coefficient and a digital input signal, and another mode dedicated to the serial loading of new coefficients during the field blanking period.

An address generator provides a sequence of loading addresses to a multiplexer for loading a set of interpolation coefficients into the coefficient RAM. The multiplexer also receives a sequence of read addresses (from an external source). The multiplexer is switched to connect the selected addresses to the address line of the coefficient RAM according to one of the two operational modes: in the first mode a set of interpolation coefficients are serially input and stored in RAM under control of the loading addresses and in the second mode the stored coefficients are output under control of the read addresses to the multiplier at the pixel rate. A plurality of such stages may be interconnected such that, in the first operational mode, the coefficient RAMs are serially loaded and, in the second mode, the coefficient RAMs are concurrently addressed such that different stored interpolation coefficients are applied to consecutive digital signals to provide an output interpolated (decimated) according to a non-integer ratio.

BRIEF DESCRIPTION OF THE DRAWINGS

The invention will be described in relation to the drawings, in which.

DETAILED DESCRIPTION OF THE PREFERRED EMBODIMENT

Figure 1:
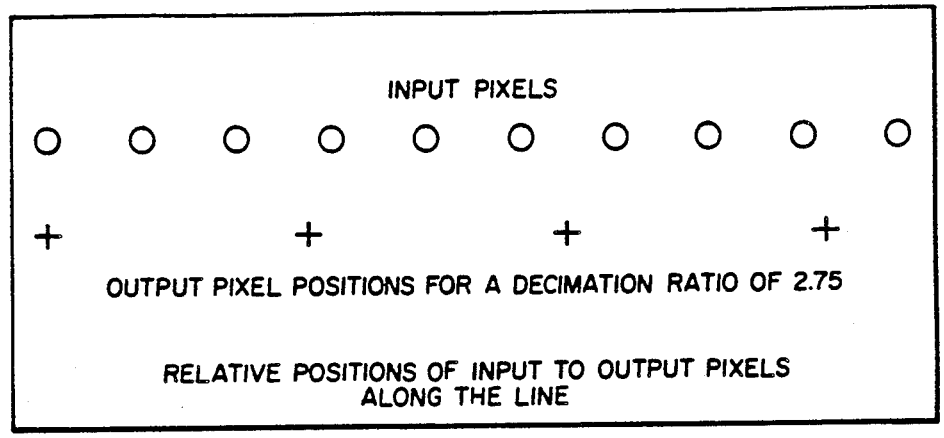
FIG. 1 is an exemplary decimation diagram showing the relative positions of input to output pixels along a line.

The requirement of a non-integer decimation factor arises from the changing relationship of output to input pixel positions, as shown in FIG. 1 for a decimation ratio of 2.75 in the horizontal direction. Such a ratio means that an output sample is generated for every input sample spacing of 2.75. Since the contribution (the coefficient) of each input pixel to the weighting function producing the output pixel depends on the instantaneous location of the output pixel (relative to the input pixels), the horizontal FIR filter coefficients must be changed at the input pixel rate. A similar decimation ratio in the vertical direction requires changing the vertical FIR filter coefficients at the line rate. For a dynamic pan or zoom, entirely new sets of horizontal and vertical FIR filter coefficients need to be provided for every field during the progress of the pan or zoom.

Figure 2:
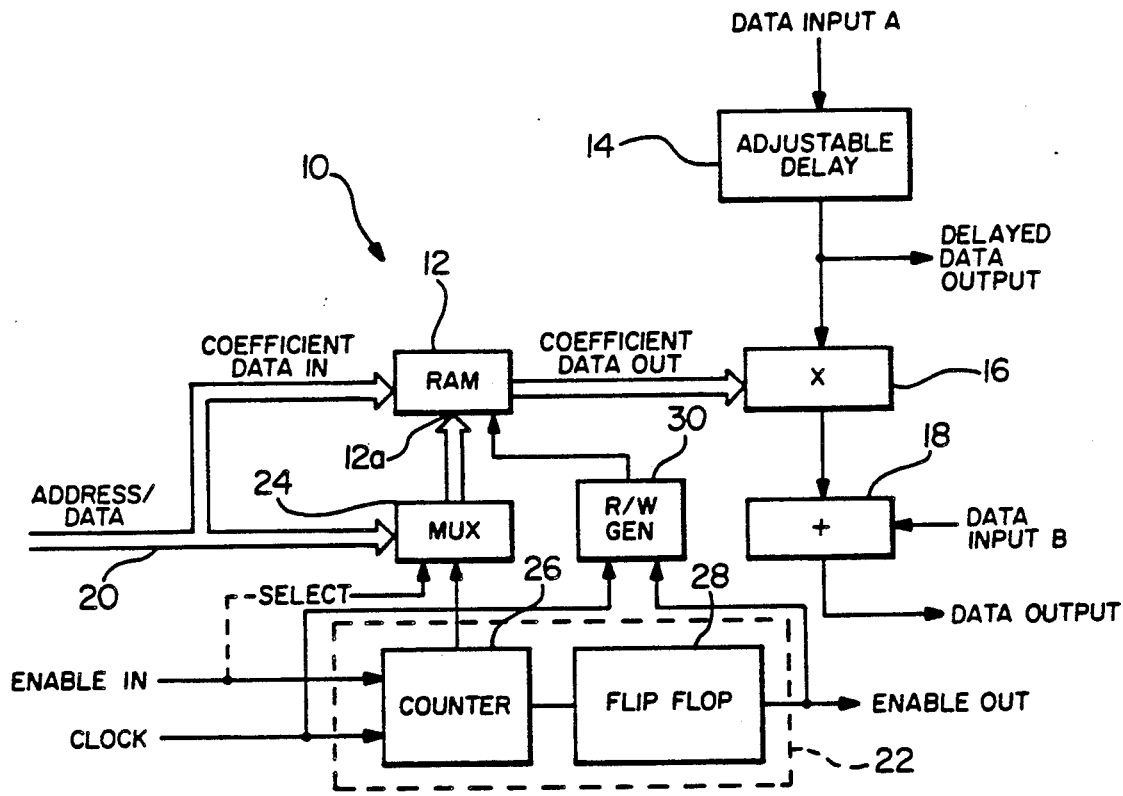
FIG. 2 shows the basic implementation of a high speed computational stage for accomplishing decimation at the input data rate and coefficient update during the vertical blanking period.

FIG. 2 shows a block diagram of a computational stage 10 for transforming an input sequence of digital image signals into an output sequence of digital image signals according to a transfer function represented by a set of interpolation coefficients stored in a random access memory 12. More particularly, the computational stage 10 weights the input sequence of image signals by computing an output digital image signal from the product of an input digital image signal and a particular coefficient. Each computational stage 10 thus constitutes a processing element for operating on one image signal at a time. As will be shown subsequently in FIGS. 3 and 4, pluralities of such computational stages are interconnected in a system architecture to provide a multi-tap FIR filter function. Referring again to FIG. 2, digital image signals are input to an adjustable delay 14, which provides the delay required to implement a decimator, interpolator, or other FIR filter function. The delay 14 may also be used to compensate for delays resulting from the use of pipeline registers (not shown in FIG. 2) within the computational stage 10 or elsewhere in the system architecture. A delayed output is available at this point to feed image signals to a subsequent computational stage.

One of the coefficients is selected by applying an appropriate address to the address port 12a of the RAM 12. A delayed input signal from the delay 14 is multiplied by the selected coefficient in a multiplier 16 and the product thereof is summed together with a second signal input B applied to an adder 18. The resulting summed signal constitutes the output of the computational stage 10. As better shown in the system architectures of FIGS. 3 and 4, the second input B originates from the summed signal output of the preceding computational stage.

The RAM 12 is operable in two modes, a first mode in which a set of filter coefficients are serially input on an address/data bus 20 and stored in the RAM 12 under control of a sequence of loading addresses provided by an address generator 22, and a second mode in which the stored coefficients are addressed under control of read addresses supplied on the address/data bus 20 (from an external source, not shown) and applied to the multiplier 16. In the second mode, the coefficients can be applied to the multiplier 16 at an extremely rapid rate, e.g., video rates of 30 mHz or greater are achievable with conventionally available components. This is of particular usefulness in non-integer decimation since the coefficients need to change at the same rate at the input data. The read addresses on the common address/data bus 20 and the loading addresses from the address generator 22 are selectively input to the address port 12a of the RAM 12 via a multiplexer 24. The appropriate routing of the read or loading addresses is determined by the select action of the multiplexer 24 according to the operational mode of the RAM 12. In particular, an ENABLE IN pulse to the address generator 22 is disabled during the second operational mode. This routes the address/data bus 20 to the RAM address port 12a via the multiplexer 24 so that read addresses can be supplied to the RAM 12.

The address generator 22 includes a counter 26 for providing a predeterminal sequence of loading addresses for operation in the first mode. A flip-flop 28 connected to the overflow output of the counter 26 provides a pulse when the sequence is completed. The RAM 12 is serially loaded as follows:

1. The ENABLE IN pulse is enabled at the start of a load sequence. This routes the address counter output to the RAM address port 12a via the multiplexer 24.
2. Coefficient data are applied to the address/data input bus 20 and strobed by applying a pulse to a CLOCK line, which drives a read/write pulse generator 30 for the RAM 12 and also increments the address counter 26 so that the next coefficient value may be transferred to the RAM 12.
3. When the RAM 12 is fully loaded (the address sequence is completed), the overflow output of the counter 26 toggles the flip-flop 28, pulsing the read/write generator 30 and enabling the ENABLE OUT line. The ENABLE OUT line is used as the ENABLE IN to a subsequent computational stage 10 to allow its RAM 14 to be loaded.

Figure 3:
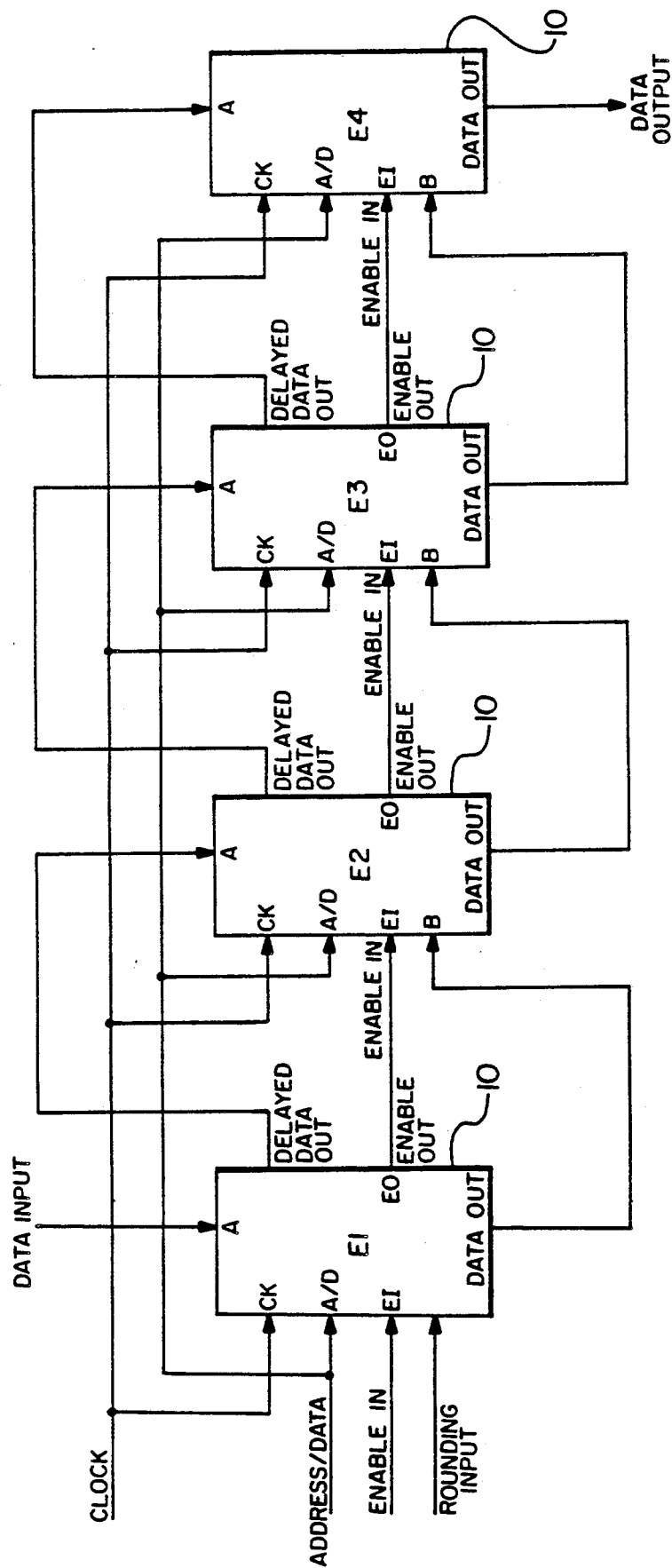
FIG. 3 is a diagram of four computational stages, each as shown in FIG. 2, arranged in parallel to constitute a horizontal FIR filter.
Figure 4:
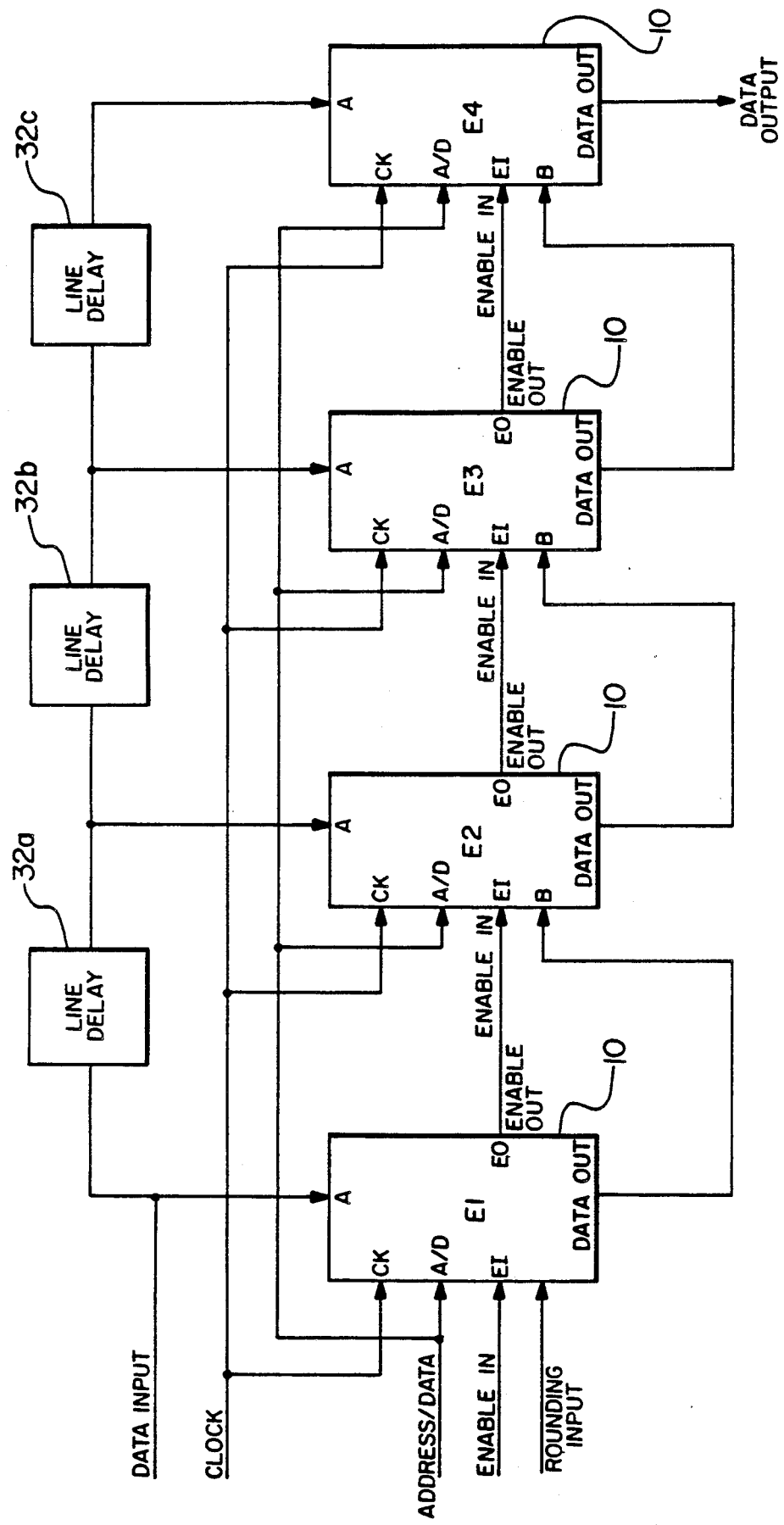
FIG. 4 is a diagram of four computational stages, each as shown in FIG. 2, arranged in parallel with line delays to constitute a vertical FIR filter.

Examples of the interconnected use of a plurality of the computational stages 10 is shown in FIGS. 3 and 4. A four-tap horizontal FIR interpolation application is shown in FIG. 3. The address/data bus 20 is connected in parallel to each computational stage 10 to implement the two aforementioned operational modes. In the first mode, coefficients are serially loaded into the interconnected stages 10, that is, E1 before E2, E2 before E3, and so on, by serial activation of the ENABLE IN line to the respective stages 10. In the ENABLE IN line to the respective stages 10. In the second mode, the stages 10 are concurrently addressed such that different stored coefficients are applied to consecutive digital input signals to provide an output decimated according to a non-integer decimation ratio. FIG. 4 shows the addition of line delays 32a, 32b, and 32c for implementing a vertical FIR filter. A two dimensional function may be implemented by combining the configurations of FIGS. 3 and 4.

Figure 5:
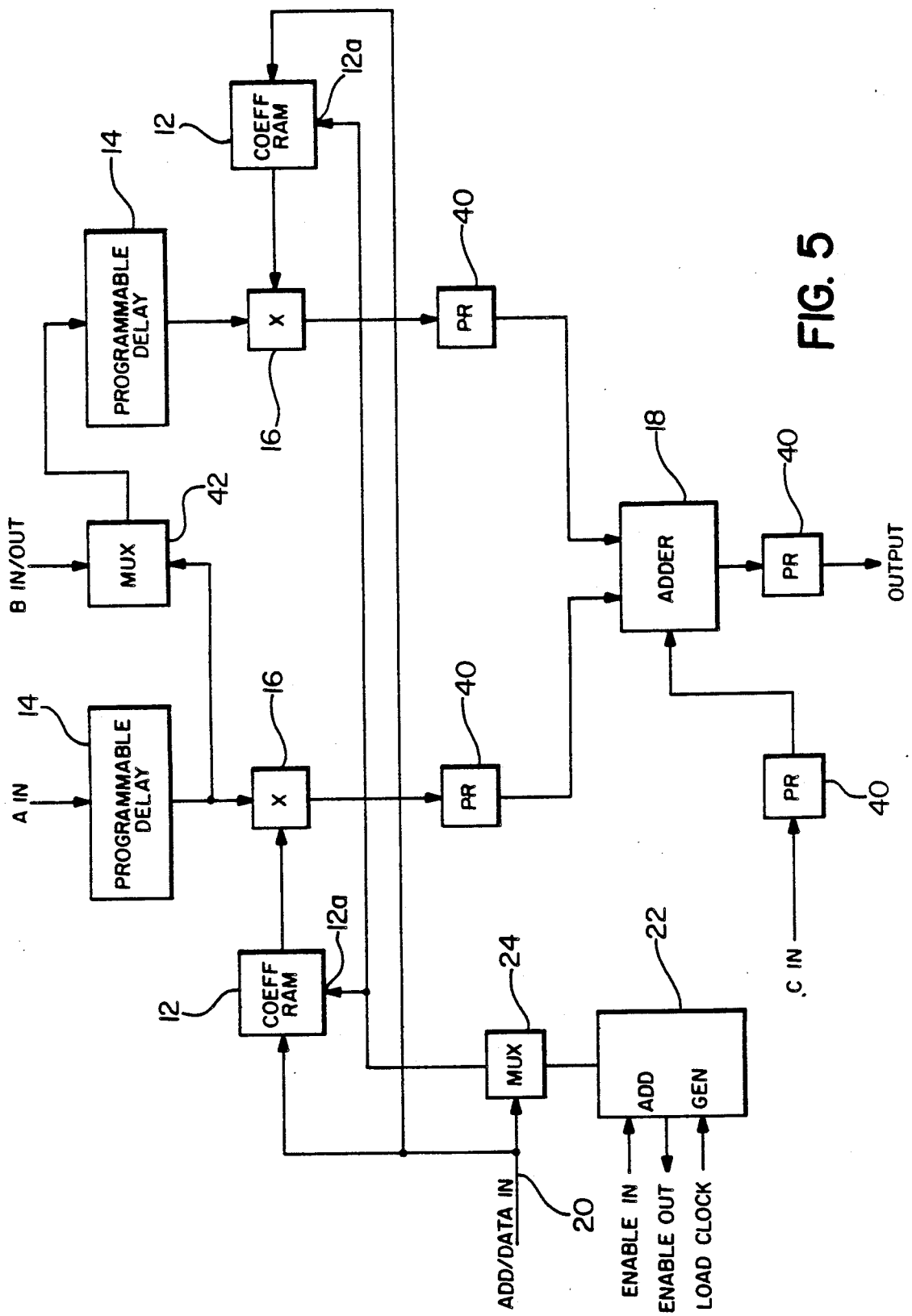
FIG. 5 is a block diagram of an application specific integrated circuit (ASIC) including two of the computational stages shown in FIG. 2.

FIG. 5 shows a configuration of two computational stages 10 especially adapted for implementation in an application specific integrated circuit (ASIC). As is seen in FIG. 5, all elements of the stages 10 are replicated twice excepting for the address generator 22 and the multiplexer 24, which in singular form are capable of concurrently addressing the pair of coefficient RAMs 12 as well as serial loading the pair of RAMs 12 with coefficients. Pipeline register delays 40 are provided in a typical pipelined configuration and a multiplexer 42 provides additional flexibility in routing the input to the second programmable delay 12. In addition, a third input (C IN) is provided to the adder 18 for interconnecting with the preceding stage.

Both the computational stage of FIG. 2 and the ASIC of FIG. 5 are exemplary of designs that significantly reduce component count and power dissipation, as well as minimize printed circuit board complexity when the stages or ASICs are interconnected. The ASIC design of FIG. 5, which is presently preferred from a manufacturing standpoint, is a CMOS gate array conventionally implemented in 1.5$\mu$ technology which, with gate delays of around 1 ns, allows an implementation at 30 MHz. For HDTV signal processing systems requiring interpolation at, e.g., a 120 MWord s$^{-1}$ data rate, the data input is demultiplexed into a more manageable b 4$\times$30 MWord s$^{-1}$ channels and the disclosed ASICs are interconnected to form each channel. With the input data comprising 10 bits, 8 bit coefficient accuracy is maintained and, to minimize rounding or truncation errors, full resolution is maintained on the ASIC. However, truncation of the output to 18 bits is employed to reduce pinout requirements. This is sufficient to enable a 10 bit filter to be implemented without error.

The invention has been described in detail with particular reference to a presently preferred embodiment, but it will be understood that variations and modifications can be effected within the spirit and scope of the invention.

What is claimed is:

1. An interpolation filter for transforming an input sequence of digital image signals into an output sequence of interpolated digital signals according to a computational algorithm applied in a plurality of interconnected computational stages arranged in parallel with the outputs thereof summed to form the output sequence of digital signals, the improvement wherein at least one of the computational stages comprises:

a random access coefficient memory having a input for serially storing interpolation coefficients and a high speed parallel output, both controlled by an address line;

multiplier means responsive to the output of said coefficient memory and to the input sequence of digital image signals for generating the product of a digital input signal and a stored interpolation coefficient;

address generator means for providing a sequence of loading addresses for loading a set of interpolation coefficients into said random access coefficient memory, said address generator means responding to an enable input to begin said sequence and generating an enable output at the end of said sequence;

multiplexer means for selectively routing either the sequence of loading addresses or a sequence of read addresses to the address line of said random access coefficient memory; and means for switching said multiplexer means to provide a selected one of two modes for operating said coefficient memory, a first mode in which a set of interpolation coefficients are serially input and stored in said memory under control of the loading addresses and a second mode in which the stored coefficients are addressed under control of the read addresses and output to said multiplier means at the sequential rate by which said image signals are applied to said multiplier means, whereby in the first mode a series of interconnected computational stages are loaded in serial and in the second mode the series of interconnected computational stages are concurrently addressed such that selected interpolation coefficients are applied to consecutive digital signals.

2. An interpolation filter as claimed in claim 1 for use in television standards conversion to decimate higher definition input signals into lower definition output signals, and wherein in the second mode the series of interconnected computational stages are concurrently addressed such that different stored coefficients are applied to consecutive digital signals to provide an output decimated according to a non-integer decimation ratio.

3. An interpolation filter as claimed in claim 1 wherein said computational stage further includes:

a second random access coefficient memory for storing a second set of interpolation coefficients, said second memory having input and address lines commonly connected with the corresponding lines of said first memory;

second multiplier means responsive to the output of said second memory and to a second sequence of digital input signals for generating the product of a digital input signal from the second sequence and a stored coefficient from the second set;

an adder for generating the sum of the output of both said multiplier means; and wherein said pair of coefficient memories is concurrently operated in said first or second modes by common connection with said address generator means and said multiplexer means.

4. An interpolation filter as claimed in claim 3 further including means for delaying said first sequence of digital signals prior to its application to said first multiplier means, and wherein said delayed sequence of digitals signals is applied to said second multiplier means in place of said second sequence of digital signals.

5. An interpolation filter as claimed in claim 1 wherein the enable output of said address generator means is applied to the enable input of a subsequent address generator means in a subsequently interconnected computational stage.

6. An interpolation filter as claimed in claim 5 wherein said address generator means includes a counter having a sequence of counts that constitute the sequence of loading addresses.

* * * * *